United States Patent
Kim et al.

(10) Patent No.: US 10,768,859 B1
(45) Date of Patent: Sep. 8, 2020

(54) HISTORY-BASED MEMORY CONTROL SYSTEM AND METHOD

(71) Applicants: SK hynix Inc., Icheon (KR); Korea University Industry Cooperation Foundation, Seoul (KR)

(72) Inventors: Seonwook Kim, Icheon (KR); Yoonah Paik, Icheon (KR); Jaeyung Jun, Icheon (KR)

(73) Assignees: SK hynix Inc., Icheon (KR); Korea University Industry Cooperation Foundation, Seoul (KR)

( * ) Notice: Subject to any disclaimer, the term of this patent is extended or adjusted under 35 U.S.C. 154(b) by 0 days.

(21) Appl. No.: 16/449,172

(22) Filed: Jun. 21, 2019

(30) Foreign Application Priority Data

Apr. 10, 2019 (KR) .......................... 10-2019-0042080

(51) Int. Cl.
*G06F 3/06* (2006.01)

(52) U.S. Cl.
CPC .......... *G06F 3/0659* (2013.01); *G06F 3/0604* (2013.01); *G06F 3/0673* (2013.01)

(58) Field of Classification Search
CPC ..... G06F 3/0659; G06F 3/0673; G06F 3/0604
See application file for complete search history.

(56) References Cited

U.S. PATENT DOCUMENTS

| | | | | |
|---|---|---|---|---|
| 5,822,772 A | * | 10/1998 | Chan | G11C 7/22 711/158 |
| 6,389,514 B1 | * | 5/2002 | Rokicki | G06F 12/0215 365/230.03 |
| 2003/0061459 A1 | * | 3/2003 | Aboulenein | G06F 12/0215 711/167 |
| 2007/0294470 A1 | * | 12/2007 | Van Dyke | G06F 13/161 711/104 |
| 2016/0148654 A1 | * | 5/2016 | Sohn | G11C 7/1063 365/189.07 |

FOREIGN PATENT DOCUMENTS

| | | |
|---|---|---|
| KR | 2011197707 A | 10/2011 |
| KR | 20130108905 A | 10/2013 |
| KR | 20130111188 A | 10/2013 |
| KR | 20160111122 A | 9/2016 |

\* cited by examiner

*Primary Examiner* — Francisco A Grullon

(57) ABSTRACT

A memory controller uses a history of the rows accessed by commands from a command queue in a command queue circuit to predict whether a second access performed immediately after the command queue becomes empty will be to a same row as a first access performed immediately before the command queue became empty. When the second access is predicted to be to a different row, the row corresponding to the first access is closed in response to the command queue becoming empty. When the second access is predicted to be to the same row, the row corresponding to the first access is not closed in response to the command queue becoming empty.

14 Claims, 5 Drawing Sheets

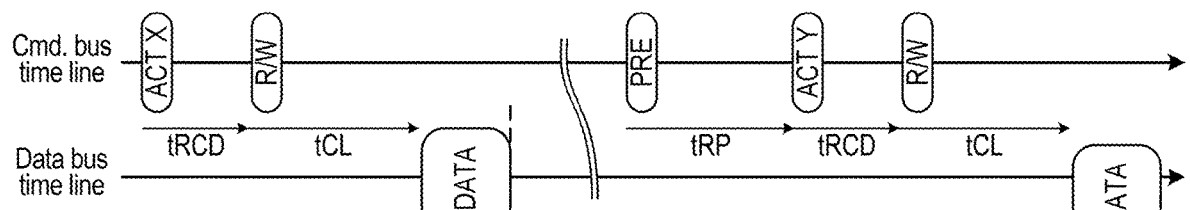
FIG. 1
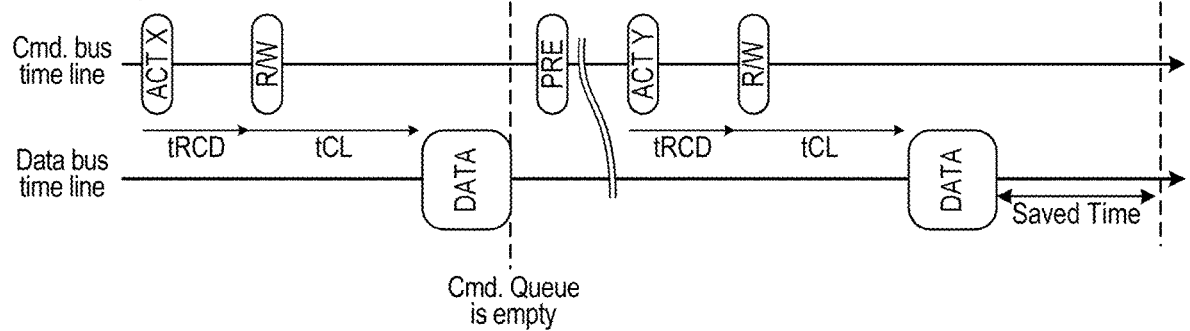
FIG. 2
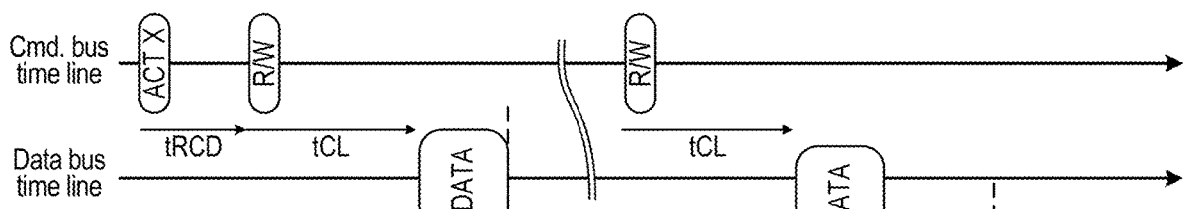
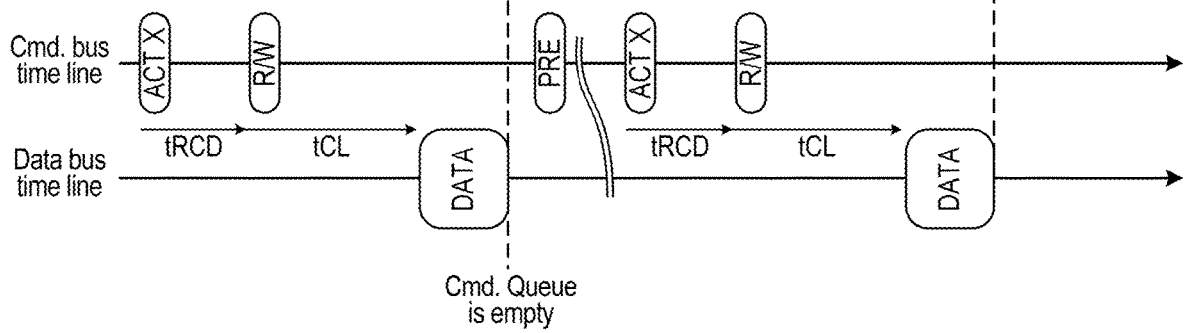

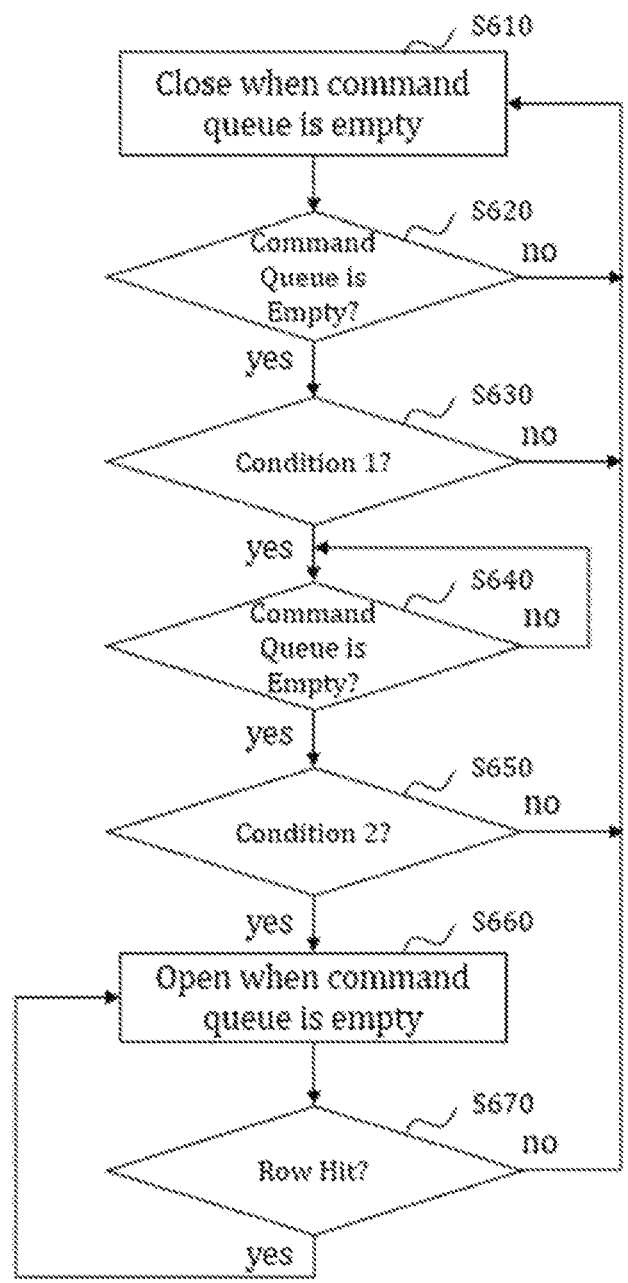

ically with an external clock signal such as a system clock signal. The input and output data of an SDRAM are synchronized with an active edge of a system clock signal. DDR (double data rate) SDRAMs are higher speed memory devices which provide two times the operating speed of a conventional SDRAM. DDR SDRAMs allow data to be transferred at both the rising edge and falling edge of a system clock signal. DDR SDRAMs may be used in a multi-core system.

HISTORY-BASED MEMORY CONTROL SYSTEM AND METHOD

CROSS-REFERENCE TO RELATED APPLICATION

This application claims priority under 35 U.S.C. § 119 to Korean Patent Application No. 10-2019-0042080 filed on Apr. 10, 2019, which is incorporated herein by reference in its entirety.

BACKGROUND

1. Field

Illustrative embodiments relate to a history-based memory control system and method, and more particularly, to a memory control system and method which predict a row hit or a row miss based on a history.

2. Discussion of the Related Art

SDRAM (synchronous dynamic random access memory) devices are various types of DRAMs (dynamic random access memories) which operate synchronously with an external clock signal such as a system clock signal. The input and output data of an SDRAM are synchronized with an active edge of a system clock signal. DDR (double data rate) SDRAMs are higher speed memory devices which provide two times the operating speed of a conventional SDRAM. DDR SDRAMs allow data to be transferred at both the rising edge and falling edge of a system clock signal. DDR SDRAMs may be used in a multi-core system.

An SDRAM or a DDR SDRAM includes a memory array bank. Each memory array includes data elements which are organized by rows and columns. Each of data elements in a row may be addressed by a column address and may be typically a data word. Each row may also be referred to as a page. Currently, in an SDRAM or a DDR SDRAM, only one row may be open at a time. Once the content of an open row is latched in a row data buffer, subsequent memory requests for different column addresses in the open row may be quickly serviced from the row data buffer. Such a memory access is referred to as a row hit. If a different row is requested and needs to be open, a corresponding memory access is referred to as a row miss.

In an open page policy that is adopted in an SDRAM or a DDR SDRAM, after read/write is performed by activating a row in a memory array bank, precharge is not performed and the row is maintained in the open state. Thereafter, when the same row is accessed (in the case of a row hit), read/write may be performed without activating the row.

Conversely, when a different row is accessed (in the case of a row miss), the row of the open state is closed, a precharge is performed, and read/write is performed after activating the different row. Precharge prepares the bit lines connecting the data elements with the data buffer for data transfer, and may be performed when no rows are in the open state.

In the open page policy, in the case where a command queue in a memory controller is empty, a conventional memory system adopts any one of an always close scheme of always performing precharging in response to the command queue becoming empty and an always open scheme of always not performing precharging in response to the command queue becoming empty.

RELATED ART DOCUMENT

Patent Document

Japanese Unexamined Patent Publication No. 2011-197707 entitled "Memory Control Device, Memory Control System, Write Device and Memory Control Method" discloses determining whether to close an open row according to a hit rate of a bank of a memory device.

Korean Unexamined Patent Publication No. 2013-0111188 entitled "Memory Device and Operating Method Thereof" discloses processing commands by a memory device according to priority.

Korean Unexamined Patent Publication No. 2013-0108905 entitled "Page Buffer, Memory Device Including the Same and Method for Operating the Device" discloses a page buffer for a memory device.

SUMMARY

As described above, the always open and always close schemes have advantages and disadvantages depending on whether the same row or a different row is accessed after the command queue is empty. Therefore, embodiments of the disclosure are directed to reducing a delay time due to activation and precharge that results from opening a row in the case of a row hit and from closing a row in the case of a row miss through predicting the row hit or the row miss for a next access after a command queue is empty.

In an embodiment, a history-based memory control method comprises: performing, by a memory controller when the memory controller is in a first mode, a closing act of closing an open row in response to a command queue in a command queue circuit becoming empty; performing a first command queue determination act of determining whether the command queue is empty; performing, by the memory controller, a first access determination act of determining whether a first condition is true, wherein the first condition is true when a first access made after the command queue became empty is to a row which was accessed immediately before the command queue became empty; in response to the first condition being true, performing a second command queue determination act of determining whether the command queue is empty; in response to the second command queue determination act determining that the command queue is empty, performing, by the memory controller, a second access determination act of determining whether a second condition is true, wherein the second condition is true when a second access from the command queue is made to a row in which a state transition has occurred; and setting the memory controller to a second mode when the second access determination act determines that second condition is true, wherein the memory controller allows an open row to remain open when the command queue become empty and the memory controller is in the second mode.

In an embodiment, a history-based memory control system comprises a memory device; and a memory controller configured to control accesses to the memory device based on access requests from a central processing system, wherein the memory controller performs: a closing act of closing an open row when a command queue in a command queue circuit in the memory controller is empty and the memory controller is in a first mode; a first command queue determination act of determining whether the command queue is empty; a first access determination act of determining whether a first access performed after the command queue was determined to be empty is made to a row which was accessed immediately before the command queue was determined to be empty; a second command queue determination act of determining whether the command queue is empty, after performing the first access determination act; a second access determination act of determining whether a second access from the command queue is made to a row in which a state transition has occurred; and setting the memory controller to a second mode when the second access from the command queue is made to the row in which a state transition has occurred, wherein the memory controller allows an open row to remain open when the command queue becomes empty and the memory controller is in the second mode.

In an embodiment, a history-based memory control method is performed by a memory controller, the method comprising: when the memory controller is in a first mode: performing a first queue determination of whether a command queue in a command queue circuit is empty; in response to the first queue determination determining that the command queue is empty, determining whether a first condition is true, wherein the first condition is true when a row accessed before the command queue became empty is the same as a row accessed after the command queue became empty; and in response to determining that the first condition is true: performing a second queue determination of whether the command queue is empty, in response to the second queue determination determining that the command queue is empty, determining whether a second condition is true, wherein the second condition is true when a row accessed after the second determination that command queue is empty is the same as a row accessed at a state transition, and in response to determining that the second condition is true, setting the memory controller to a second mode; and when the memory controller is in the second mode: determining whether an access is a row hit; and in response to determining that the access is not the row hit, setting the memory controller to the first mode.

According to the embodiments, it is possible to reduce a delay time due to activation and precharge by opening a row in the case of a row hit and closing a row in the case of a row miss through predicting the row hit or the row miss for a next access after a command queue is empty.

BRIEF DESCRIPTION OF THE DRAWINGS

FIG. 1 is a bus timing diagram illustrating accessing a different row after a command queue in a memory controller is empty, according to the conventional art.

FIG. 2 is a bus timing diagram illustrating accessing the same row after a command queue in a memory controller is empty, according to the conventional art.

FIG. 6 is a flow chart to assist in the explanation of prediction of a row hit or a row miss in a decision and control circuit and precharge in accordance with the embodiment of the disclosure.

DETAILED DESCRIPTION

Figure 3:
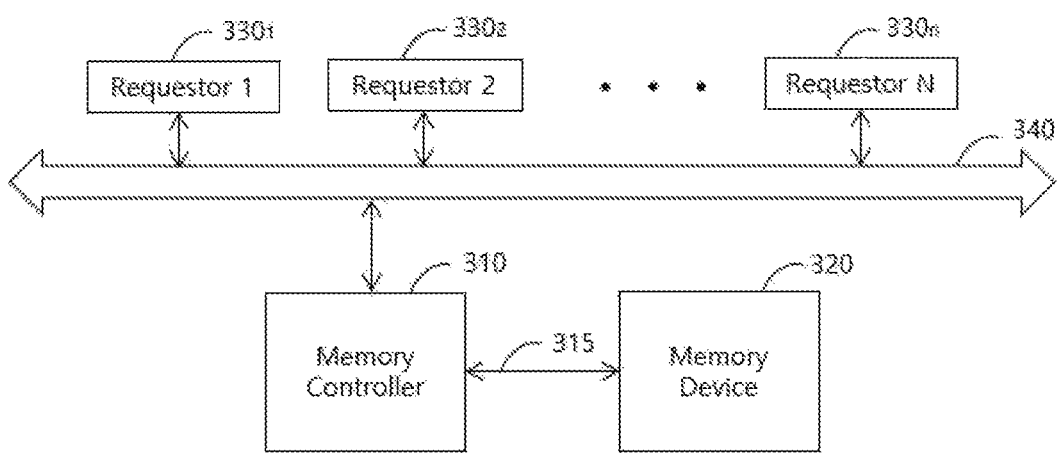
FIG. 3 is a diagram illustrating a system 300 to which an embodiment of the disclosure may be applied.

Advantages and features of the disclosure and methods to achieve them will become apparent from the descriptions of illustrative embodiments herein below with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The disclosure will be defined only by the scope of the claims.

Terms used in this specification are used for describing various embodiments, and do not limit the disclosure. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

When one element is referred to as being 'connected to' or 'coupled to' another element, it may indicate that the former element is directly connected or coupled to the latter element or another element is interposed therebetween. On the other hand, when one element is referred to as being 'directly connected to' or 'directly coupled to' another element, it may indicate that no element is interposed therebetween. Furthermore, 'and/or' includes each of described items and one or more combinations.

Throughout the specification, like reference numerals refer to like elements. Therefore, although the same or similar reference numerals are not mentioned or described in a corresponding drawing, the reference numerals may be described with reference to other drawings. Furthermore, although elements are not represented by reference numerals, the elements may be described with reference to other drawings.

In an open page policy, in the case where a command queue in a memory controller is empty, a conventional memory system adopts any one of an always close scheme of always precharging a corresponding row and an always open scheme of always not precharging a corresponding row.

The advantages and disadvantages of the always close scheme and the always open scheme are described below with respect to FIGS. 1 and 2.

FIG. 1 is a timing diagram in the case of accessing a different row after a command queue in a memory controller is empty than the row accessed immediately before the command queue became empty, according to the conventional art.

i) The always open scheme (timing diagram A in FIG. 1).

As an active command ACT X for activating a row X and a read/write command R/W are sequentially generated on a command bus time line, data is generated on a data bus time line and the command queue becomes empty. Thereafter, before performing an active command ACT Y for activating a row Y that is a different row than the row X and a read/write command R/W after a command queue is empty, a precharge command PRE for precharging the bit lines and clearing a data buffer needs to be generated and a time tRP is therefore required before performing the ACT Y command.

That is to say, while the command queue in a memory controller is empty after performing read/write for a row of a first address, the row is kept open. Thereafter, since a row miss occurs when the new row Y having a second address is accessed, a precharge operation must be performed before the new row Y is activated to perform read/write, and thus, a total time of tRP+tRCD+tCL is required to perform the read/write.

tRCD means a delay time from a row address to a column address, tCL means a CAS (column address strobe) latency time, and tRP means a row precharge time. Since these terms are well known to those skilled in the semiconductor design field, detailed descriptions thereof will be omitted herein.

ii) The always close scheme (timing diagram B in FIG. 1).

As an active command ACT X for activating a row X and a read/write command R/W are sequentially generated on a command bus time line, data is generated on a data bus time line and a command queue becomes empty. Accordingly, because the command queue in the memory controller is empty, a precharge command PRE is generated, closing row X.

Then, an active command ACT Y for activating a row Y as a new row and a read/write command R/W may be sequentially generated, and the new row Y may be accessed without a delay due to a row precharge time tRP by the precharge command PRE to perform read/write, and thus, a total time of tRCD+tCL is required to read or write additional data.

Therefore, in the case of accessing a different row after the command queue in the memory controller becomes empty than was accessed directly before the command queue became empty, while the time of tRP+tRCD+tCL is required in the always open scheme, the time tRCD+tCL is required to read or write additional data in the always close scheme, and as a result, in this case the always close scheme is advantageous in that a time corresponding to the row precharge time tRP may be saved.

FIG. 2 is a bus timing diagram in the case of accessing the same row after a command queue in a memory controller is empty than the row accessed immediately before the command queue became empty, according to the conventional art.

i) The always open scheme (timing diagram A in FIG. 2).

As an active command ACT X for activating a row X and a read/write command R/W are sequentially generated on a command bus time line, data is generated on a data bus time line, and the command queue becomes empty.

Thereafter, if a read/write command R/W is generated for the row X as the same row, because row X is still open it is not necessary to execute an active command ACT X for activating the row X, and only a time of tCL is required to read or write additional data.

ii) The always close scheme (timing diagram B in FIG. 2).

As an active command ACT X for activating a row X and a read/write command R/W are sequentially generated on a command bus time line, data is generated on a data bus time line, and a command queue becomes empty. Accordingly, because the command queue in a memory controller is empty, a precharge command PRE is generated, closing row X.

Thereafter, in order to access the row X as the same row and read/write data, an active command ACT X for activating the row X and a read/write command R/W are sequentially generated. For this, a total time of tRCD+tCL is required.

As a result, in the case of accessing the same row after the command queue of the memory controller is empty, since the time of tCL is required in the always open scheme and the time of tRCD+tCL is required in the always close scheme, a time corresponding to the delay time tRCD from a row address to a column address is additionally required in the always close scheme, and thus, the always open scheme is advantageous.

As described above, the always open scheme and the always close scheme have advantages and disadvantages depending on whether a row to be accessed after the command queue in the memory controller is empty is the same or different than the most recent row accessed before the command queue became empty.

Thus, an embodiment of the disclosure has a feature that, after a command queue in a memory controller becomes empty, a row hit or a row miss is predicted for a next access, and then, a row is left open in the case of a predicted row hit and is closed in the case of a predicted row miss, thereby saving delay times required to execute an active command (when the row hit is correctly predicted) and a precharge command (when the row miss is correctly predicted).

FIG. 3 is a diagram illustrating a system 300 to which an embodiment of the disclosure may be applied.

The system 300 includes a memory controller 310, a memory device 320 and a plurality of requesters 330$i$ (i=1, 2, . . . , n).

The memory controller 310 may communicate with the requesters 330$i$ (i=1, 2, . . . , n) through a bus 340.

The requesters 330$i$ (i=1, 2, . . . , n) may be different processors or other devices which may transmit memory access requests to the memory controller 310 through the bus 340.

The memory controller 310 is configured to receive memory access requests from the requesters 330$i$ (i=1, 2, . . . , n) through the bus 340 and access the memory device 320 through a memory bus 315.

The memory controller 310 arbitrates among the different requesters 330$i$ (i=1, 2, n), prioritizes the different requesters 330$i$ (i=1, 2, . . . , n), and approves services for the respective requesters 330$i$ (i=1, 2, . . . , n), one at a time, in a scheduled manner. The memory controller 310 changes each memory access request to a sequence of commands and transmits the sequence of commands to the memory device 320.

The memory device 320 includes a bank of memory arrays. Each memory array includes data elements which are organized by rows and columns. Each of the rows may be addressed by a row address. Each of data elements in a row may be addressed by a column address.

The memory device 320 may be an SDRAM (synchronous dynamic random access memory), a DDR SDRAM (double data rate synchronous dynamic random access memory) or any other type of DRAM (dynamic random access memory).

Figure 4:
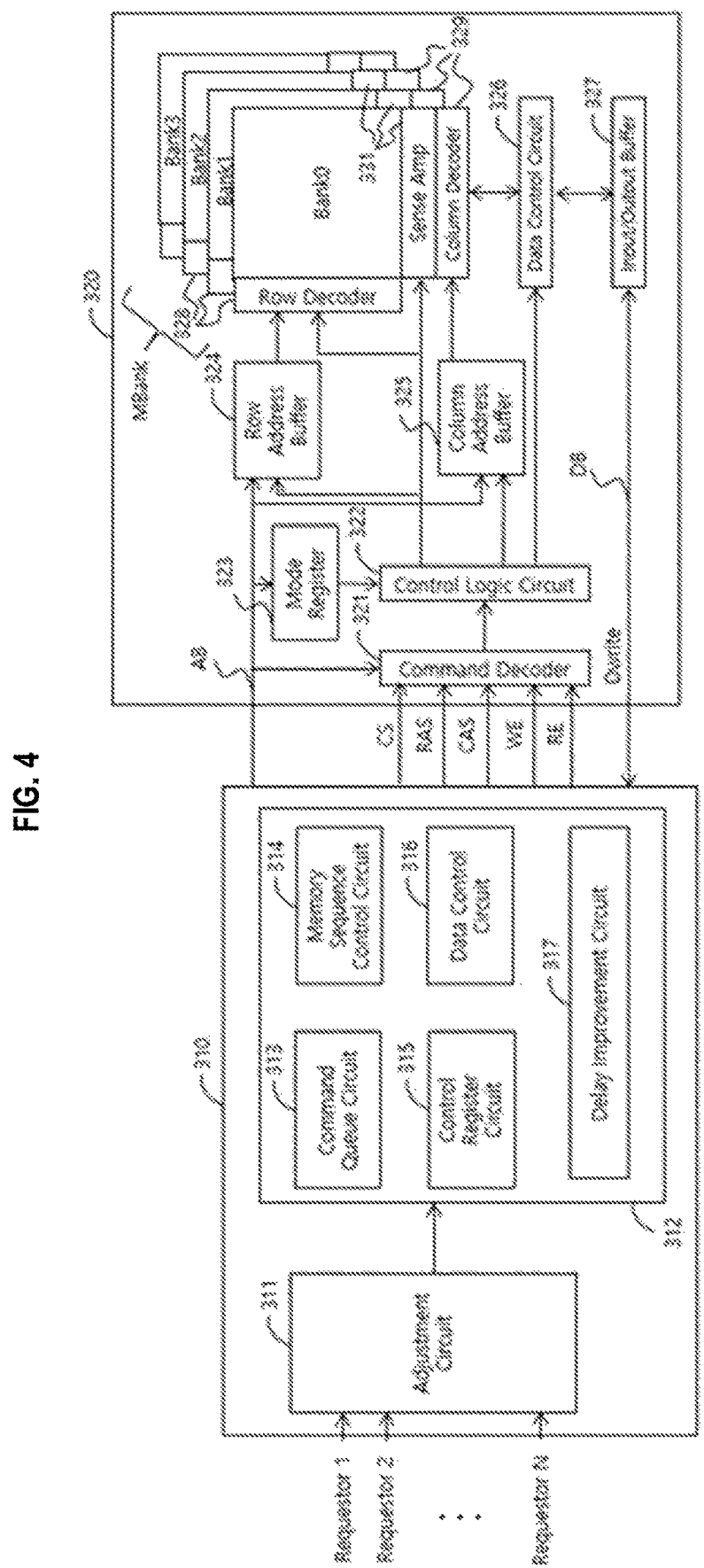
FIG. 4 is a circuit diagram illustrating a memory controller 310 and a memory device 320 in accordance with an embodiment of the disclosure.

FIG. 4 is a detailed circuit diagram illustrating a representation of an example of the memory controller 310 and the memory device 320 in accordance with an embodiment of the disclosure.

The memory controller 310 is coupled with the memory device 320 through an address bus AB and a data bus DB. The address bus AB and the data bus DB may be included in the memory bus 315 of FIG. 3. The memory device 320 includes a command decoder 321, a control logic circuit 322, a mode register 323, a row address buffer 324, a column address buffer 325, a memory bank block MBank, a data control circuit 326, and an input/output buffer 327.

The memory bank block MBank includes first, second, third, and fourth memory banks Bank0, Bank1, Bank2, and Bank3, referred to herein as memory banks Bank$i$ (i=0 to 3), each bank Bank$i$ respectively including row decoders 328, column decoders 329 and sense amplifier circuits 331. In an actual memory chip, the memory device 320 may include eight or more memory banks Banki that are physically independent of one another.

The data control circuit 326 includes therein a bank switch (not illustrated) which is controlled by a bank address, for each of the individual memory banks Banki. By activating one selected memory bank Banki by a bank switch, data transmission between the individual memory bank Banki and the data bus DB is controlled. The data bus DB is coupled with the memory controller 310 and the input/output buffer 327 in the memory device 320.

The plurality of memory banks Banki included in the memory device 320 are configured by arranging a plurality of memory cells (not illustrated) in the form of a matrix. The respective memory cells are disposed at intersections of a plurality of word lines and a plurality of bit lines which intersect with each other.

A set of a plurality of memory cells along one word line becomes one page as a unit for reading and writing data.

The row decoder 328 includes a word line driver, and drives the selection of a memory bank Banki and the selection of a word line. The sense amplifier circuit 331 includes a row of sense amplifier elements corresponding to one page which sense the bit line data of a selected memory bank Banki.

Read data corresponding to one page is selected by the column decoder 329, and is outputted to the input/output buffer 327 through the data control circuit 326. Write data supplied from the data control circuit 326 is selected by the column decoder 329 and is loaded in the sense amplifier circuit 331. In an address signal transmitted through the address bus AB from the memory controller 310, a row address is transmitted to the row address buffer 324, and a column address is transmitted to the column address buffer 325. A mode is stored in the mode register 323. A row address is transmitted to the row decoder 328 from the row address buffer 324, and a column address is transmitted to the column decoder 329 from the column address buffer 325.

Control signals such as a write enable signal WE, a read enable signal RE, a row address strobe signal RAS, a column address strobe signal CAS and a chip select signal CS are provided by the memory controller 310 to the command decoder 321. The command decoder 321 decodes the respective signals WE, RE, RAS, CAS and CS, and transmits decoded signals to the control logic circuit 322. The control logic circuit 322 outputs the timing signals of read/write and precharge operations based on the control signals such as the RAS signal, the CAS signal and the CS signal depending on a set mode read from the mode register 323. The control logic circuit 322 controls a sequence based on the timing signals, and performs control over the supply of a row address to the row decoder 328 from the row address buffer 324, the supply of a column address to the column decoder 329 from the column address buffer 325, a data read operation and a data write operation. In embodiments, the memory controller 310 produces a plurality of chip select signals CS, each chip select signal CS is provided to respective command decoders 321 of a respective one or more memory devices 320, and each of the one or more memory devices 320 connected to a given chip select signal CS may be referred to as a rank. That is, memory units that are selected by a given chip select signal CS and operate at the same time are referred to as a rank.

When a read request is received from a requester 330, the memory controller 310 transmits a read command to the memory device 320, and the memory device 320 decodes the read command and performs a read operation of desired data. When a write request is received from a requester 330, the memory controller 310 transmits a write command to the memory device 320, and the memory device 320 decodes the write command and performs a write operation of desired data.

In detail, the memory controller 310 determines whether a bank is the same bank, at a requested address. In the case of an access to a different bank, the memory controller 310 transmits first a bank active command and a row address to the memory device 320. By the bank active command and the row address, a certain bank in the memory device 320 is selected, a word line of the selected bank corresponding to the row address is selected, and data corresponding to one row on the word line is transmitted to and amplified by the sense amplifier circuit 331.

In the case of accessing the same bank, if all the rows of the bank are in a closed state (that is, there is no row in an open state), a bank active command and a row address are transmitted to the memory device 320. By the row address, a word line of a selected bank corresponding to the row address is selected, and data corresponding to one row on the word line is transmitted to and amplified by the sense amplifier circuit 331.

In the case of accessing the same bank, if a row is in an open state and a row to be accessed and the open row have the same row address, because the data to be accessed is already held in the sense amplifier circuit 331, a bank active command and a row address are not transmitted to the memory device 320.

In the case of accessing the same bank, if a row is in an open state and a row to be accessed and the open row have different row addresses, a precharge command is transmitted to erase the data held in the sense amplifier circuit 331 and prepare the bit lines for transferring data, and then, a bank active command and a row address are transmitted to the memory device 320. By the row address, a word line of a selected bank corresponding to the row address is selected, and data corresponding to one row on the word line is transmitted to and amplified by the sense amplifier circuit 331.

In a read operation, the memory controller 310 transmits a read command and a column address in the case of read. By the read command and the column address, a column switch in the data control circuit 326 is selected, and data corresponding to the column address in a page being buffered by the sense amplifier circuit 331 is read. On the other hand, in a write operation, the memory controller 310 transmits a write command and a column address in the case of write. By the write command and the column address, a column switch in the data control circuit 326 is selected, and data corresponding to the column address in a page buffered by the sense amplifier circuit 331 is written into the sense amplifier circuit 331 and thereby recorded into the bank.

In the memory device 320, once a page of data corresponding to one row on a word line is buffered by the sense amplifier circuit 331, an access to the same word line, that is, an access to the same page, may be performed within a relatively short time. However, accessing data on a word line different from a currently selected word line, that is, a different page, requires a precharge operation of first erasing data held in the sense amplifier circuit 331 and a page open operation of transmitting a different page of data corresponding to one row on a new word line to the sense amplifier circuit 331 and amplifying and buffering the data by the sense amplifier circuit 331. For this reason, accessing a different page requires a relatively long wait time before it is possible to start reading or writing data.

Even though an access to the memory device 320 from the requester 330 is a random access, for example, in the case where accesses of the same request are successive, there is a high probability that an address which is currently accessed or an address adjacent thereto will be accessed again in the near future.

Therefore, the memory controller 310 in accordance with the embodiment of the disclosure predicts whether a next access will be to the same page or a different page (that is, to a same row or a different row), during a current access.

In order to realize such memory control, the memory controller 310 includes an adjustment circuit 311 and a control circuit 312. The adjustment circuit 311 adjusts access requests from the plurality of requesters 330$i$ (i=1, 2, ..., n). The control circuit 312 receives a read request or a write request that is adjusted by the adjustment circuit 311, and controls the memory device 320 according to a corresponding request.

The control circuit 312 includes a command queue circuit 313, a memory sequence control circuit 314, a control register circuit 315, a data control circuit 316 and a delay improvement circuit 317.

The command queue circuit 313 is a circuit which includes a command queue that stores access commands (such as read commands and write commands), for example, in a FIFO scheme. In an embodiment, the command queue circuit 313 includes a command queue for each rank. In an embodiment, the command queue circuit 313 includes a command queue for each bank Bank$i$.

The memory sequence control circuit 314 performs sequence control for the memory device 320 according to an access request.

The control register circuit 315 stores various data such as set values necessary to execute a memory sequence.

The data control circuit 316 performs transmission control of outputting write data Dwrite from the requester 330 to the input/output buffer 327 in the memory device 320 through the data bus DB in the case of a write request, and transmission control of receiving read data Dread through the data bus DB from the input/output buffer 327 in the memory device 320 in the case of a read request.

The delay improvement circuit 317 predicts whether a next access is the same page or a different page, determines whether to end a current access to the memory device 320 as an open row or a closed row, based on a prediction result, and transmits a signal indicating the determined open row or closed row to the memory sequence control circuit 314 so that the memory sequence control circuit 314 will either close or leave open a currently-open row, according to the output of the delay improvement circuit 317.

Figure 5:
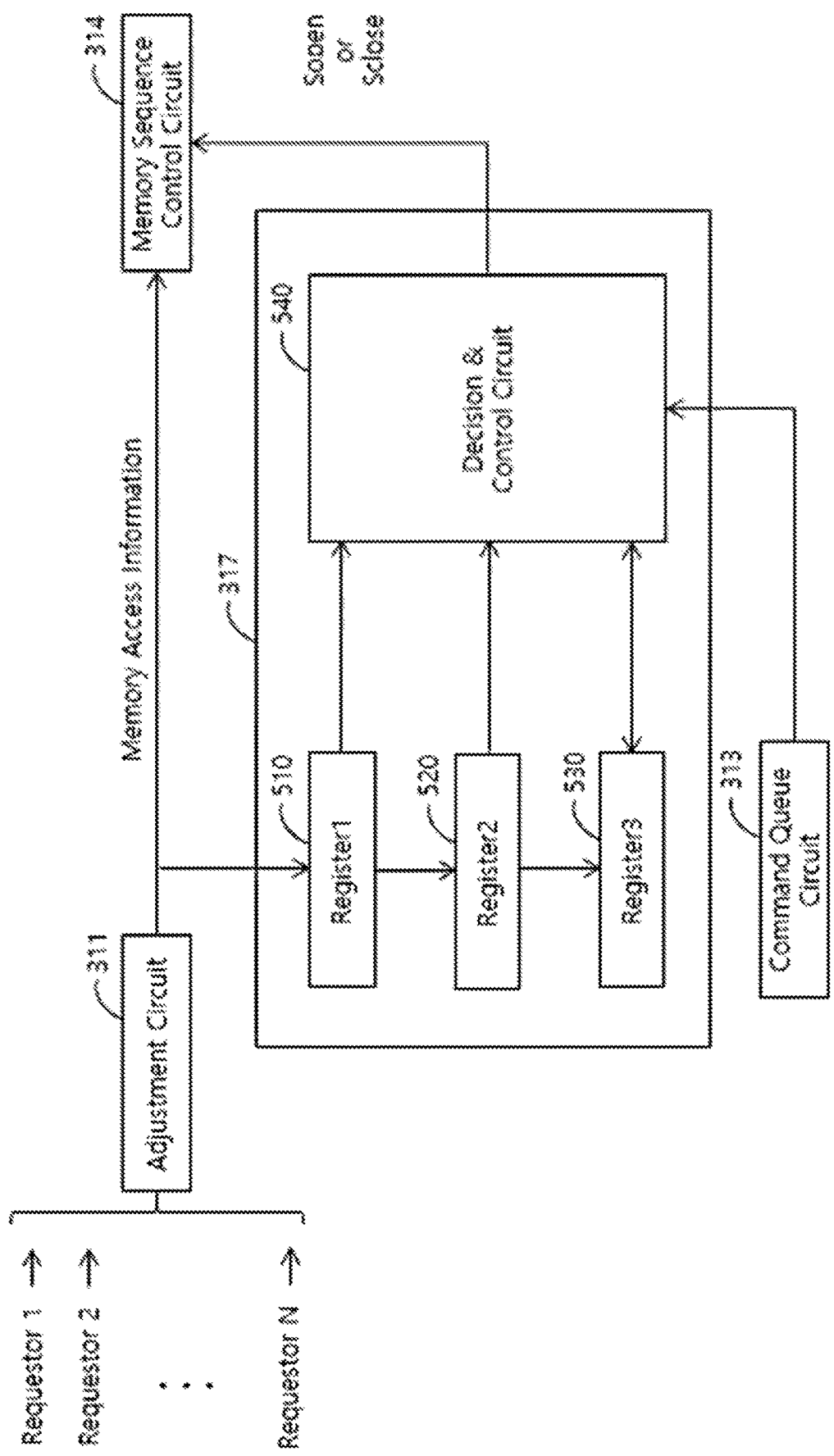
FIG. 5 is a block diagram illustrating components of the memory controller 310 which are related with improvement in delay, in accordance with the embodiment of the disclosure.

FIG. 5 is a detailed block diagram illustrating a representation of an example of components of the memory controller 310 which are related with improvement in delay, in accordance with the embodiment of the disclosure. In FIG. 5, among the components of the memory controller 310, the control register circuit 315 and the data control circuit 316 which are not directly related with a delay improving function will be omitted.

As illustrated in FIG. 5, the adjustment circuit 311 receives access requests from requesters Requestor 1, Requestor 2, ..., Requestor N. The adjustment circuit 311 transmits an adjusted memory access information (including a mode and an address) from a requester, to the memory sequence control circuit 314.

The delay improvement circuit 317 includes a first register 510, a second register 520, a third register 530, and a decision and control circuit 540. In an embodiment wherein the command queue circuit 313 includes a command queue for each bank Bank$i$ or rank of the memory device 320, the delay improvement circuit 317 may include respective first, second and third registers 510, 520, and 530 for each bank Bank$i$ or rank, and the delay improvement circuit 317 outputs respective closing signals Sclose and respective opening signals S open for each bank Bank$i$ or rank.

The first register 510 stores a row address which is currently being accessed. The second register 520 stores a row address which was previously accessed. At the beginning of execution of a command from the command queue circuit 313, the second register 520 is loaded with the row address in the first register 510, after which the first register 510 is loaded with the row address of the command being executed. The third register 530 stores a corresponding row address when a condition 1 occurs. Condition 1 occurs when a row being accessed first after a command queue in the command queue circuit 313 became empty is the same as a row which was accessed immediately before the command queue in the command queue circuit 313 became empty.

The operation of the decision and control circuit 540 will be described with reference to FIG. 6.

FIG. 6 is a flow chart of a process 600 for prediction of a row hit or a row miss in the decision and control circuit 540 and for control of precharge operations (that is, closing of open rows) in accordance with an embodiment of the disclosure. In an embodiment, the process 600 may be performed independently for each bank Bank$i$ or rank of the memory device 320. The process 600 operates in two modes: a "close when command queue is empty" mode including steps S610 through S650, and an "open when command queue is empty" mode including steps S660 and S670.

At S610, the decision and control circuit 540 in the memory controller 310 outputs a closing signal S close to the memory sequence control circuit 314, indicating that an open row is to be closed when a command queue in the command queue circuit 313 is empty. In embodiments wherein there is a closing signal Sclose for each bank Bank$i$ or rank, the respective closing signal Sclose for a bank Bank$i$ or rank indicates that an open row of the bank is to be closed when a corresponding command queue of the bank Bank$i$ or rank in the command queue circuit 313 is empty.

Thereafter, at S620 the decision and control circuit 540 in the memory controller 310 determines whether the command queue of a corresponding bank Bank$i$ or rank in the command queue circuit 313 is empty. If the command queue of the corresponding bank Bank$i$ or rank in the command queue circuit 313 is not empty, the process 600 returns to the step S610; otherwise, at S620 the process 600 proceeds to S630

At S630, the decision and control circuit 540 in the memory controller 310 determines whether a row to be accessed first after the command queue in the command queue circuit 313 is empty is the same as a row which is accessed immediately before the command queue became empty, that is, whether a condition 1 illustrated at the step S630 of FIG. 6 is true. In embodiments, condition 1 may be determined by comparing the row address stored in first register 510 to the row address stored in second register 520. In an embodiment, when condition 1 is true, at S630 the process 600 causes the third register 530 to be loaded with the row address in the second register 520 and proceeds to S640; otherwise, at S630 the process 600 proceeds back to S610.

At S640, having determined that the row to be accessed first after the command queue of the bank Bank$i$ or rank in the command queue circuit 313 became empty is the same as the row which was accessed immediately before the command queue became empty, the decision and control circuit 540 in the memory controller 310 determines again whether the command queue of the bank Banki or rank in the command queue circuit 313 is empty. If the command queue of the corresponding bank Banki or rank in the command queue circuit 313 is not empty, at S640 the process 600 returns to the step S640; otherwise at S640 the process 600 proceeds to S650.

At S650, the decision and control circuit 540 in the memory controller 310 determines whether the row which is accessed first after the command queue in the command queue circuit 313 became empty at S640 is the same as a row which is previously accessed at a state transition; that is, whether a condition 2 is true.

The condition 2 is true when a row which is accessed first after a command queue in the command queue circuit 313 is empty is the same as a row which is previously accessed at a state transition. In an embodiment, a state transition occurs when condition 1 occurs and the row address is stored in register 530, when the process 600 changes from being in the "close when command queue is empty" mode to the "open when command queue is empty" mode, or when the process 600 changes from being in the "open when command queue is empty" mode to the "close when command queue is empty" mode. That is, a state transition occurs when the process 600 transitions to S610 from S650 or S670, when the process 600 transitions to S640 from S630, and when the process 600 transitions to S660 from S650. If the condition 2 is true, at S650 the process 600 proceeds to S660; otherwise, the process 600 proceeds to S610.

At S660, when the command queue in the command queue circuit 313 is empty, the decision and control circuit 540 in the memory controller 310 outputs an opening signal Sopen to the memory sequence control circuit 314 to open the corresponding row. In embodiments wherein there is an opening signal S open for each bank Banki or rank, the respective opening signal Sopen for a bank Banki or rank indicates that an open row of the bank is to be left open when a corresponding command queue of the bank Banki or rank in the command queue circuit 313 is empty.

At S670, in the open row state, the decision and control circuit 540 in the memory controller 310 determines whether a row address of a command is a row hit. In an embodiment, whether a row hit occurs at S670 may be determined by comparing the contents of the first register 510 to the contents of the second register 520. If the row address is a row hit, the process 600 returns to the step S660; otherwise, the process 600 returns to the step S610.

Although various embodiments have been described for illustrative purposes, it will be apparent to those skilled in the art that various changes and modifications may be made without departing from the spirit and scope of the invention as defined in the following claims.

What is claimed is:

1. A history-based memory control method comprising:
    performing, by a memory controller when the memory controller is in a first mode, a closing act of closing an open row in response to a command queue in a command queue circuit becoming empty;
    performing a first command queue determination act of determining whether the command queue is empty;
    performing, by the memory controller, a first access determination act of determining whether a first condition is true, wherein the first condition is true when a first access made after the command queue became empty is to a row which was accessed immediately before the command queue became empty;
    in response to the first condition being true, performing a second command queue determination act of determining whether the command queue is empty;
    in response to the second command queue determination act determining that the command queue is empty, performing, by the memory controller, a second access determination act of determining whether a second condition is true, wherein the second condition is true when a second access from the command queue is made to a row in which a state transition has occurred; and
    setting the memory controller to a second mode when the second access determination act determines that second condition is true,
    wherein the memory controller allows an open row to remain open when the command queue become empty and the memory controller is in the second mode.

2. The history-based memory control method according to claim 1, further comprising:
    performing, by the controller when the memory controller is in the second mode, a row hit determination act of determining whether a third access is a row hit; and
    setting the memory controller to the first mode when the row hit determination act determines that the third access is not a row hit.

3. The history-based memory control method according to claim 2, further comprising performing the second command queue determination act again when the command queue is determined to be not empty by the second command queue determination act.

4. A history-based memory control system comprising:
    a memory device; and
    a memory controller configured to control accesses to the memory device based on access requests from a central processing system,
    wherein the memory controller performs:
        a closing act of closing an open row when a command queue in a command queue circuit in the memory controller is empty and the memory controller is in a first mode;
        a first command queue determination act of determining whether the command queue is empty;
        a first access determination act of determining whether a first access performed after the command queue was determined to be empty is made to a row which was accessed immediately before the command queue was determined to be empty;
        a second command queue determination act of determining whether the command queue is empty, after performing the first access determination act;
        a second access determination act of determining whether a second access from the command queue is made to a row in which a state transition has occurred; and
        setting the memory controller to a second mode when the second access from the command queue is made to the row in which a state transition has occurred,
    wherein the memory controller allows an open row to remain open when the command queue becomes empty and the memory controller is in the second mode.

5. The history-based memory control system according to claim 4, wherein the memory controller determines whether a third access is a row hit, and sets the memory controller to the first mode in response to determining that the third access is not a row hit.

6. The history-based memory control system according to claim 5, wherein the memory controller repeatedly performs the second command queue determination act when the second command queue determination act determines that the command queue is not empty.

7. The history-based memory control system according to claim 5, wherein the memory controller further comprises a first register and a second register, and further comprising:
the memory controller, in response to a command issuing from the command queue, sets the second register to a value of the first register and then sets the first register to a row address of the command;
the memory controller performs the first access determination act by comparing the value of the first register to a value of the second register; and
the memory controller determines whether the third access is the row hit by comparing the value of the first register to the value of the second register.

8. The history-based memory control system according to claim 7, wherein the memory controller further comprises a third register, and further comprising:
the memory controller, in response to setting the memory controller to the second mode, sets the third register to the value of the second register; and
the memory controller performs the second access determination act by comparing the value of first register to a value of the third register.

9. A history-based memory control method performed by a memory controller, the method comprising:
when the memory controller is in a first mode:
performing a first queue determination of whether a command queue in a command queue circuit is empty;
in response to the first queue determination determining that the command queue is empty, determining whether a first condition is true, wherein the first condition is true when a row accessed before the command queue became empty is the same as a row accessed after the command queue became empty; and
in response to determining that the first condition is true:
performing a second queue determination of whether the command queue is empty,
in response to the second queue determination determining that the command queue is empty, determining whether a second condition is true, wherein the second condition is true when a row accessed after the second determination that command queue is empty is the same as a row accessed at a state transition, and
in response to determining that the second condition is true, setting the memory controller to a second mode; and
when the memory controller is in the second mode:
determining whether an access is a row hit; and
in response to determining that the access is not the row hit, setting the memory controller to the first mode.

10. The method of claim 9,
when the memory controller is in the first mode, closing an open row in response to determining that the command queue is empty; and
when the memory controller is in the second mode, not closing the open row in response to determining that the command queue is empty.

11. The method of claim 9, wherein the state transition corresponds to the memory controller being set to the second mode.

12. The method of claim 9, wherein performing the first queue determination, performing the second queue determination, determining whether the first condition is true, determining whether the second condition is true, and determining whether the access is a row hit are each performed in response to respective commands being issued from the command queue.

13. The method of claim 9, wherein the memory controller comprises a first register and a second register, the method further comprising:
in response to a command issuing from the command queue, setting the second register to a value of the first register and then setting the first register to a row address of the command;
determining whether first condition is true by comparing the value of the first register to a value of the second register; and
determining whether the access is a row hit by comparing a value of the first register to a value of the second register.

14. The method of claim 13, wherein the memory controller further comprises a third register, the method further comprising:
in response to setting the memory controller to the second mode, setting the third register to the value of the second register; and
determining whether the second condition is true by comparing the value of first register to a value of the third register.

* * * * *